United States Patent
Ko et al.

(10) Patent No.: US 9,219,220 B2
(45) Date of Patent: Dec. 22, 2015

(54) ULTRASONIC TRANSDUCER, ULTRASONIC PROBE, AND ULTRASOUND IMAGE DIAGNOSIS APPARATUS

(71) Applicant: Samsung Electronics Co., Ltd., Gyeonggi-do (KR)

(72) Inventors: Hyun-phill Ko, Gyeonggi-do (KR); Dong-hyun Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 398 days.

(21) Appl. No.: 13/688,749

(22) Filed: Nov. 29, 2012

(65) Prior Publication Data
US 2013/0169818 A1    Jul. 4, 2013

(30) Foreign Application Priority Data
Jan. 2, 2012 (KR) .................. 10-2012-0000172

(51) Int. Cl.
| | | |
|---|---|---|
| *A61B 8/00* | (2006.01) | |
| *H01L 41/09* | (2006.01) | |
| *H01L 41/083* | (2006.01) | |
| *B06B 1/06* | (2006.01) | |

(52) U.S. Cl.
CPC ............ *H01L 41/083* (2013.01); *B06B 1/0622* (2013.01)

(58) Field of Classification Search
CPC ..... H03H 9/09; F16F 15/005; G01N 29/2437; H04R 17/00; B06B 1/0603; B06B 1/0622; B06B 1/0629; B06B 1/067; B06B 1/0681; B06B 1/0685; G10K 11/002; G10K 11/02; G10K 11/165; G10K 11/28

USPC .................... 310/322, 326, 327, 334
See application file for complete search history.

(56) References Cited

U.S. PATENT DOCUMENTS

| | | | |
|---|---|---|---|
| 5,706,564 A * | 1/1998 | Rhyne | ............... 29/25.35 |
| 6,049,159 A | 4/2000 | Barthe et al. | |
| 6,645,150 B2 | 11/2003 | Angelsen et al. | |
| 7,358,650 B2 | 4/2008 | Kondo et al. | |
| 7,755,256 B2 | 7/2010 | Shibamoto et al. | |
| 7,956,514 B2 | 6/2011 | Oakley et al. | |

(Continued)

FOREIGN PATENT DOCUMENTS

| | | |
|---|---|---|
| CN | 1666568 A | 9/2005 |
| CN | 1753643 A | 3/2006 |

(Continued)

OTHER PUBLICATIONS

C.S. Desilets, J.D. Fraser, Gordon S. Kino, The Design of Efficient Broad-band Piezoelectric Transducers, May 1978. pp. 115-125, Published in Sonics and Ultrasonics, IEEE Transactions on (vol. 25, Issue: 3).

*Primary Examiner* — Thomas Dougherty
(74) *Attorney, Agent, or Firm* — Cha & Reiter, LLC

(57) ABSTRACT

An ultrasonic transducer, an ultrasonic probe, and an image diagnosis apparatus perform an ultrasonic procedure. The ultrasonic transducer includes: a piezoelectric layer; an acoustic matching layer disposed on an upper surface of the piezoelectric layer; and a plurality of back efficiency layers that are disposed on a lower surface of the piezoelectric layer and have different acoustic impedances. The sensitivity, bandwidth, and pulse length of the ultrasonic transducer may be controlled by appropriately changing acoustic impedances and thicknesses of the back efficiency layers.

16 Claims, 3 Drawing Sheets

(56) References Cited

U.S. PATENT DOCUMENTS

| | | |
|---|---|---|
| 8,129,886 B2 | 3/2012 | Zhao et al. |
| 8,604,671 B2 | 12/2013 | Shikata |
| 2006/0131990 A1* | 6/2006 | Milsom et al. ............ 310/311 |
| 2006/0186765 A1* | 8/2006 | Hashimoto ............... 310/334 |
| 2007/0205697 A1* | 9/2007 | Chaggares et al. ........ 310/327 |
| 2008/0242984 A1* | 10/2008 | Oakley et al. ............ 600/442 |
| 2008/0243001 A1* | 10/2008 | Oakley et al. ............ 600/459 |
| 2008/0315724 A1 | 12/2008 | Kunkel, III |

FOREIGN PATENT DOCUMENTS

| | | | | |
|---|---|---|---|---|
| CN | 101006931 A | | 8/2007 | |
| CN | 102205310 A | | 10/2011 | |
| JP | 06-205779 A | | 7/1994 | |
| JP | 2000-143335 | * | 5/2000 | ............ C04B 35/46 |
| JP | 2000-143335 A | | 5/2000 | |
| JP | 2004-120283 A | | 4/2004 | |
| JP | 2009-201053 A | | 9/2009 | |
| JP | 2009-213137 A | | 9/2009 | |

* cited by examiner

ULTRASONIC TRANSDUCER, ULTRASONIC PROBE, AND ULTRASOUND IMAGE DIAGNOSIS APPARATUS

CLAIM OF PRIORITY

This application claims, pursuant to 35 U.S.C. 119(a), priority to and the benefit of the earlier filing date of Korean Patent Application No. 10-2012-0000172, filed on Jan. 2, 2012, in the Korean Intellectual Property Office, the disclosure of which is incorporated herein in its entirety by reference.

BACKGROUND OF THE INVENTION

1. Field of the Invention

The present invention relates to an ultrasonic transducer, an ultrasonic probe, and an ultrasound image diagnosis apparatus, and more particularly, to an ultrasonic transducer having an improved back efficiency layer structure, an ultrasonic probe, and an ultrasound image diagnosis apparatus.

2. Description of the Related Art

An ultrasound image diagnosis apparatus is an apparatus that irradiates an ultrasonic wave signal to a desired inner site of a body via a body surface of a subject and uses information of a reflected ultrasonic wave signal, that is, an ultrasonic wave echo signal, to obtain an image about a fault of soft tissues or blood flow, such as a blockage or a disease, in a non-invasive manner. Compared to other image diagnosis apparatuses, such as an X-ray diagnosis apparatus, a computerized tomography (CT) scanner, a magnetic resonance image (MRI) apparatus, or a nuclear medicine diagnosis apparatus, the ultrasound image diagnosis apparatus is relatively small and inexpensive, displays an image in real time, and has high stability due to the lack of irradiation of, for example, X-rays. Due to these advantages, the ultrasound image diagnosis apparatus is widely used for heart, abdomen, urinary system, and obstetrics diagnoses.

The ultrasound image diagnosis apparatus includes an ultrasonic probe that transmits an ultrasonic wave signal to a subject and receives an ultrasonic wave echo signal reflected from the subject to obtain an ultrasonic image of the subject. The ultrasonic probe includes a transducer, a case or housing having an open top end, and a cover that is coupled to the top end of the case and directly contacts the surface of a subject. In this regard, the transducer includes a piezoelectric layer that includes a piezoelectric material for reversibly converting an electric signal and an acoustic signal, during vibration, an acoustic matching layer that reduces an acoustic impedance difference between the piezoelectric layer and the subject so as to allow an ultrasonic wave produced by the piezoelectric layer to be transmitted to the subject as much as possible, an acoustic lens layer that allows an ultrasonic wave progressing forward from the piezoelectric layer to be focused on a particular point, and a sound wave absorption layer that prevents an ultrasonic wave from progressing backward from the piezoelectric layer to prevent image distortion. The interior structure and arrangement of the transducer are key factors in determining the characteristics, shape, manufacturing process, and costs of the transducer, and thus, many businesses have implemented simple structures thereof.

SUMMARY OF THE INVENTION

The present invention provides an ultrasonic transducer having an improved structure of back efficiency layers located under a piezoelectric layer, an ultrasonic probe, and an ultrasound image diagnosis apparatus.

According to an aspect of the present invention, there is an ultrasonic transducer including: a piezoelectric layer; an acoustic matching layer disposed on an upper surface of the piezoelectric layer; and a plurality of back efficiency layers that are disposed on a lower surface of the piezoelectric layer and have different acoustic impedances.

The acoustic impedances of the back efficiency layers may decrease in a direction away from the piezoelectric layer. Alternatively, the acoustic impedances of the back efficiency layers sequentially may decrease to a predetermined back efficiency layer, and then increase from the predetermined back efficiency layer in a direction away from the piezoelectric layer.

A thickness of each of the back efficiency layers may be in a range of $\lambda/16$ to $\lambda/2$, in which $\lambda$ is the acoustic wavelength of the ultrasonic transducer. In this regard, the back efficiency layers may have different thicknesses.

The piezoelectric layer may include a plurality of piezoelectric devices that are arranged spaced apart from each other. In this regard, kerfs, that is, the distances between transducer elements, such as among the piezoelectric devices may extend to only a top surface of a back efficiency layer that is the closest to the piezoelectric devices from among the back efficiency layers. Alternatively, kerfs among the piezoelectric devices may extend to at least one of the back efficiency layers.

The acoustic matching layer may be a single layer or a multi-layer structure.

The ultrasonic transducer may further include an acoustic attenuation block located under the back efficiency layers.

According to another aspect of the present invention, there is provided an ultrasonic probe including: an ultrasonic transducer including a piezoelectric layer, an acoustic matching layer disposed on an upper surface of the piezoelectric layer, and a plurality of back efficiency layers that are disposed on a lower surface of the piezoelectric layer and have different acoustic impedances; and a housing for housing the ultrasonic transducer.

According to another aspect of the present invention, there is provided an ultrasound image diagnosis apparatus including: an ultrasonic probe; and a signal processor that produces an ultrasonic image based on an ultrasonic wave echo signal detected by the ultrasonic probe, wherein the ultrasonic probe includes an ultrasonic transducer including a piezoelectric layer, an acoustic matching layer disposed on an upper surface of the piezoelectric layer, and a plurality of back efficiency layers that are disposed on a lower surface of the piezoelectric layer and have different acoustic impedances; and a housing for housing the ultrasonic transducer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
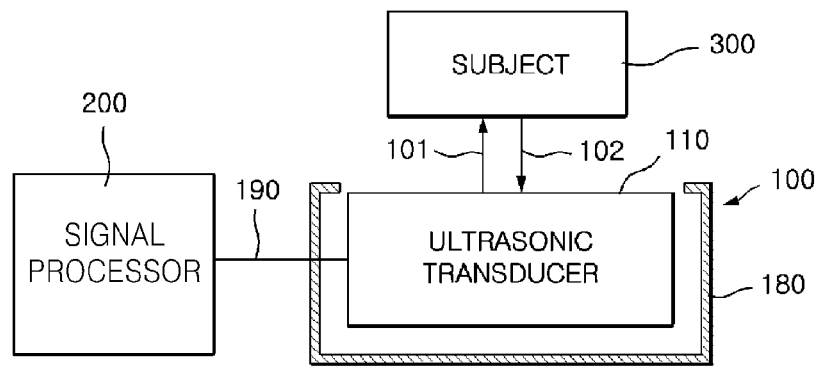
FIG. 1 is a block diagram of an ultrasound image diagnosis apparatus according to an exemplary embodiment of the present invention.

Hereinafter, embodiments of the present invention are described in detail with reference to the attached drawings. In the drawings, like reference numerals denote like elements, and the sizes or thicknesses of the respective elements may be enlarged for clarity. In the following description, a detailed explanation of known related functions and constructions may be omitted to avoid unnecessarily obscuring the subject matter of the present invention. This invention may, however, be embodied in many different forms and should not be construed as limited to the exemplary embodiments set forth herein. Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

Expressions such as "at least one of," when preceding a list of elements, modify the entire list of elements and do not modify the individual elements of the list.

FIG. 1 is a block diagram to explain an ultrasound image diagnosis apparatus according to an exemplary embodiment of the present invention.

Referring to FIG. 1, the ultrasound image diagnosis apparatus according to the exemplary embodiment includes an ultrasonic probe 100 and a signal processor 200.

The ultrasonic probe 100 includes an ultrasonic transducer 110 that transmits an ultrasonic wave 101 to a subject 300, for example, a human body, and receives an ultrasonic wave 102 reflected from the subject 300, and a housing 180 for housing the ultrasonic transducer 110. The ultrasonic probe 100 includes a cable 190 for connection with the signal processor 200 of the ultrasound image diagnosis apparatus. The signal processor 200 controls the ultrasonic probe 100 and, based on an echo signal providing information of the subject 300 detected by the ultrasonic probe 100, the signal processor 200 produces an image of the subject 300, which may be displayed on a display included in or connected to the signal processor 200.

Figure 2:
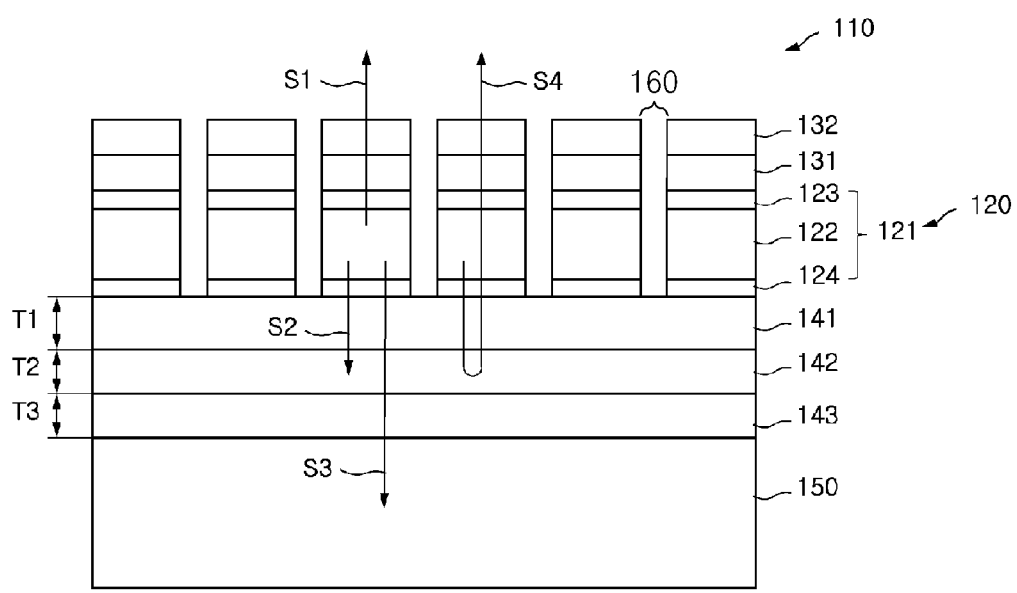
FIG. 2 illustrates an example of an ultrasonic transducer housed in an ultrasonic probe of the ultrasound image diagnosis apparatus illustrated in FIG. 1.

FIG. 2 illustrates an example of the ultrasonic transducer 110 housed in the ultrasonic probe 100 of the ultrasound image diagnosis apparatus of FIG. 1. Referring to FIG. 2, the ultrasonic transducer 110 includes a piezoelectric layer 120, a first acoustic matching layer 131 and a second acoustic matching layer 132 located on an upper surface of the piezoelectric layer 120, and back efficiency layers 141, 142, and 143, including a first back efficiency layer 141, a second back efficiency layer 142, and a third back efficiency layer 143 located on a lower surface of piezoelectric layer 120. An acoustic attenuation block 150 is located under the back efficiency layers 141, 142, and 143.

The piezoelectric layer 120 includes a plurality of piezoelectric devices 121. The piezoelectric devices 121 individually operate and may be spaced apart from each other to prevent interferences therebetween. The piezoelectric devices 121 may be arranged linearly (that is, 1-dimensionally) or in rows and columns (that is, 2-dimensionally) on the first back efficiency layer 141. Each of the piezoelectric devices 121 includes a piezoelectric body 122, a first electrode 123, and a second electrode 124. The piezoelectric body 122 may include a piezoelectric material that converts an electrical signal into an acoustic signal and vice versa. For example, the piezoelectric body 122 may include a ceramic of lead zirconate titanate (PZT), a monocrystal formed from a solid solution of lead zirconate niobate titanate (PZNT), a monocrystal formed from a solid solution of lead magnesium niobate titanate (PMNT), or a monocrystal formed from a solid solution of lead magnesium niobate-lead zirconate titanate (PMN-PZT). The electrodes 123 and 124 may be respectively located on two sides of the piezoelectric body 122, for example, on top and bottom ends of the piezoelectric body 122. Any one of the electrodes 123 and 124 may be a cathode or a signal electrode of the piezoelectric body 122, and the other one may be an anode or a ground electrode of the piezoelectric body 122. The electrodes 123 and 124 may be interconnected via a known manner, such as by use of a soft circuit substrate or a hard circuit substrate. The piezoelectric devices 121 receive an electric signal and produce an ultrasonic wave, and convert an ultrasonic wave transmitted by the subject 300 of FIG. 1 into an electric signal.

The acoustic matching layers 131 and 132 appropriately match an acoustic impedance of the piezoelectric layer 120 and an acoustic impedance of the subject 300 to reduce loss of the ultrasonic wave transmitted to the subject 300 or the reflected ultrasonic wave transmitted back by the subject 300. The matching of the acoustic impedances of the subject 300 and the piezoelectric layer 120 may be performed by adjusting physical parameters, such as a velocity of sound, thickness, and acoustic impedance of the acoustic matching layers 131 and 132. That is, the acoustic matching layers 131 and 132 suppress reflection of an ultrasonic wave due to a difference between the acoustic impedance of the subject 300 and the acoustic impedance of the piezoelectric layer 120. FIG. 2 illustrates an exemplary embodiment of two acoustic matching layers. However, the exemplary embodiment is not limited to the structure of FIG. 2. Instead of the two acoustic matching layers 131 and 132, one acoustic matching layer or three or more acoustic matching layers may be used in alternative exemplary embodiments. In addition, the acoustic matching layers 131 and 132 may be divided into a plurality of devices and may be located on a top end of each of the piezoelectric devices 121. In other words, kerfs 160 for suppressing interferences among the piezoelectric devices 121 may be formed through or between the acoustic matching layers 131 and 132.

Also, the ultrasonic transducer 110 may further include an acoustic lens layer, known in the art, that is disposed on an upper surface of the second acoustic matching layer 132 of FIG. 2 and allows an ultrasonic wave signal progressing upward to be focused on a particular site. In this case, the irradiating and receiving of an ultrasonic wave may be performed via the acoustic lens layer contacting a diagnosis location, such as the skin, of the subject 300.

The back efficiency layers 141, 142, and 143 are located under the piezoelectric layer 120. The back efficiency layers 141, 142, and 143 may have different acoustic impedances and different thicknesses along the longitudinal length of the ultrasonic transducer, as shown in FIG. 2.

The acoustic impedances and thicknesses of the back efficiency layers 141, 142, and 143 affect the behavior of ultrasonic waves S2, S3, and S4 that are produced by the piezoelectric layer 120 and progress under the piezoelectric layer 120. Thus, characteristics of the ultrasonic transducer 110 are controlled by appropriately changing the acoustic impedances and thicknesses of the back efficiency layers 141, 142, and 143.

The back efficiency layers 141, 142, and 143 may satisfy the inequality of Equation 1 below:

$$Z_1 > Z_2 > Z_3 \quad (1)$$

wherein an acoustic impedance of the first back efficiency layer 141 is $Z_1$, an acoustic impedance of the second back efficiency layer 142 is $Z_2$, and an acoustic impedance of the third back efficiency layer 143 is $Z_3$.

In this regard, the first back efficiency layer 141 is the closest layer to the piezoelectric layer 120, and the third back efficiency layer 143 is the farthest layer from the piezoelectric layer 120.

Also, the thicknesses T1, T2, and T3 of the back efficiency layers 141, 142, and 143, respectively, may be in a range of $\lambda/16$ to $\lambda/2$, in which $\lambda$ is the acoustic wavelength of the ultrasonic transducer.

The back efficiency layers 141, 142, and 143 having such ranges of the acoustic impedances Z1, Z2, and Z3, respectively, and the thicknesses T1, T2, and T3, respectively, absorb the ultrasonic wave S2 progressing downward, that is, progressing toward the acoustic attenuation block 150, to reduce noise, and change the direction of the ultrasonic wave S4 progressing downward into a desired direction, so that characteristics, for example, a bandwidth, a pulse duration, sensitivity, etc., of the ultrasonic transducer 110 may be improved.

The ultrasonic transducer 110 according to the exemplary embodiment of the present invention includes the back efficiency layers 141, 142, and 143, that is, three back efficiency layers. However, more generally, the ultrasonic transducer 110 may include N back efficiency layers. In this regard, the acoustic impedance arrangement of the N back efficiency layers may satisfy the inequality of Equation 2. In this regard, N is a natural number, that is, a positive integer equal to 2 or greater.

$$Z_1 > Z_2 > \ldots > Z_N \quad (2)$$

According to some alternative embodiments, the acoustic impedance arrangement of the N back efficiency layers may be set sequentially in a direction away from the piezoelectric layer 120, or the acoustic impedances of the N back efficiency layers may sequentially decrease to a predetermined back efficiency layer, and then increase from the predetermined back efficiency layer away from the piezoelectric layer 120 and by doing so, characteristics of the ultrasonic transducer 110 are changed. In this case, any one intermediate back efficiency layer of the N back efficiency layers has the lowest acoustic impedance and uppermost and lowermost back efficiency layers may have an acoustic impedance that is relatively higher than an acoustic impedance of the intermediate back efficiency layer.

Also, thicknesses of the N back efficiency layers may satisfy the inequality of Equation 3 below.

$$\frac{\lambda}{16} \leq T_i \leq \frac{\lambda}{2}, (i = 1, 2, \ldots, N) \quad (3)$$

wherein $T_i$ is the thickness of an $i^{th}$ back efficiency layer.

As shown in FIG. 2, the acoustic attenuation block 150 may be formed under the back efficiency layers 141, 142, and 143. The acoustic attenuation block 150 may attenuate an acoustic energy that passes through the back efficiency layers 141, 142, and 143 among ultrasonic waves produced by the piezoelectric layer 120, and may support layers located above the acoustic attenuation block 150.

Hereinafter, an operation of the ultrasonic transducer 110 according to the exemplary embodiment of the present invention is described in detail.

When a voltage is applied to the piezoelectric layer 120, the piezoelectric body 122 converts an electric energy into an ultrasonic acoustic energy to produce ultrasonic waves. The produced ultrasonic waves include an ultrasonic wave S1 that moves forward, that is, moves toward the subject 300 of FIG. 1 and the ultrasonic waves S2, S3, and S4 that move backward, that is, move toward the back efficiency layers 141, 142, and 143. Among the ultrasonic waves S2, S3, and S4 progressing toward the back efficiency layers 141, 142, and 143, the ultrasonic wave S2 is absorbed by the back efficiency layers 141, 142, and 143, and the ultrasonic wave S3 is absorbed by the acoustic attenuation block 150. Also, the direction of the ultrasonic wave S4, from among the ultrasonic waves S2, S3, and S4, progressing toward the back efficiency layers 141, 142, and 143, is changed due to a difference between the acoustic impedance of the piezoelectric layer 120 and the acoustic impedance of the first back efficiency layer 141 or a difference among the acoustic impedances of the back efficiency layers 141, 142, and 143 and thus, the ultrasonic wave S4 progresses forward. Because the size of the absorbed ultrasonic wave S2, the reflected ultrasonic wave S4, or the ultrasonic wave S3 that is transmitted to the acoustic attenuation block 150 may vary according to the acoustic impedances $Z_1$, $Z_2$, and $Z_3$ and the thicknesses $T_1$, $T_2$, and $T_3$ of the back efficiency layers 141, 142, and 143, so characteristics of the ultrasonic transducer 110 may be controlled by appropriately changing the acoustic impedances $Z_1$, $Z_2$, and $Z_3$ and the thicknesses T1, T2, and T3 of the back efficiency layers 141, 142, and 143.

Hereinafter, an example of the back efficiency layers 141, 142, and 143 of the ultrasonic transducer 110 according to the present invention is described in detail below.

Table 1 below shows characteristics of a first example of the ultrasonic transducer 110.

TABLE 1

|  | First back efficiency layer | Second back efficiency layer | Third back efficiency layer | Acoustic attenuation block |
|---|---|---|---|---|
| Acoustic impedance | 13.5 MRayl | 4.0 MRayl | 2.0 MRayl | 1.5 MRayl |
| Sensitivity dB, 1 V/V | | −60.28 | | |
| Bandwidth@6 dB % | | 80.47 | | |
| Pulse length @20 dB µs | | 0.254 | | |
| Cycle | | 1.84 | | |

In Table 1, the acoustic impedances Z1, Z2, and Z3 of the back efficiency layers 141, 142, and 143 satisfy the inequality in Equation 1. The thicknesses T1, T2, and T3 of the back efficiency layers 141, 142, and 143 are individually controlled to have different values within a range of $\lambda/16$ to $\lambda/2$.

Also, Table 2 below shows the performance of an ultrasonic transducer manufactured according to a first comparative example. The ultrasonic transducer of the first comparative example refers to a case in which the acoustic impedances Z1, Z2, and Z3 of the back efficiency layers 141, 142, and 143 satisfy the inequality of Equation 1 and the thicknesses T1, T2, and T3 thereof are all the same.

TABLE 2

|  | First back efficiency layer | Second back efficiency layer | Third back efficiency layer | Acoustic attenuation block |
|---|---|---|---|---|
| Acoustic impedance | 13.5 MRayl | 4.0 MRayl | 2.0 MRayl | 1.5 MRayl |
| Sensitivity dB, 1 V/V | −74.06 | | | |
| Bandwidth@6 dB % | 65.2 | | | |
| Pulse length @20 dB μs | 0.415 | | | |
| Cycle | 2.34 | | | |

Comparing Table 1 and Table 2, the ultrasonic transducer 110 according to the exemplary embodiment of the present invention has a higher sensitivity, a wider bandwidth, and a shorter pulse length than the ultrasonic transducer of first comparative example.

Also, Table 3 below shows the performance of an ultrasonic transducer manufactured according to a second comparative example. The ultrasonic transducer of the second comparative example refers to a case without back efficiency layers and only an acoustic attenuation block is located under a piezoelectric layer. That is, the ultrasonic transducer of the second comparative example is an ultrasonic transducer having the same structure as the ultrasonic transducer 110 of FIG. 2 except that the back efficiency layers 141, 142, and 143 are excluded.

TABLE 3

|  | Case 1 | Case 2 | Case 3 |
|---|---|---|---|
| Sensitivity dB, 1 V/V | −65.02 | −63.40 | −61.91 |
| Bandwidth @6 dB % | 79.07 | 74.93 | 74.2 |
| Pulse length @20 dB μs | 0.3777 | 0.431 | 0.476 |
| Cycle | 2.69 | 3.34 | 3.69 |

In Table 3, Case 1 refers to a case in which an acoustic attenuation block has a high acoustic impedance, Case 2 refers to a case in which an acoustic attenuation block has a middle acoustic impedance, and Case 3 refers to a case in which an acoustic attenuation block has a low acoustic impedance. In this regard, the acoustic impedance of the acoustic attenuation block is determined according to a table of Reference 1 of Charles S. Desilets "The design of efficient broad band piezoelectric transducers", IEEE Transactions on Sonics and Ultrasonics, Vol. SU-25, No. 3, May 1078, hereinafter, Desilets' method.

Comparing Table 3 and Table 1, although there is an example in which a bandwidth of the ultrasonic transducer of the second comparative example is as wide as the bandwidth of the ultrasonic transducer 110, other characteristics of the example, such as sensitivity or a pulse length, are very poor compared to those of the ultrasonic transducer 110 according to the exemplary embodiment of the present invention.

Also, Table 4 below shows the performance of an ultrasonic transducer manufactured according to a third comparative example. The ultrasonic transducer of the third comparative example refers to a case in which a single back efficiency layer is located under a piezoelectric layer. That is, the ultrasonic transducer of the third comparative example is an ultrasonic transducer having the same structure as the ultrasonic transducer 110 of FIG. 2, except that a single back efficiency layer is formed instead of the back efficiency layers 141, 142, and 143.

TABLE 4

| Acoustic attenuation block | Case 4 | Case 5 | Case 6 |
|---|---|---|---|
| Sensitivity dB, 1 V/V | −60.03 | −61.30 | −62.28 |
| Bandwidth@6 dB % | 68.51 | 70.44 | 72.88 |
| Pulse length @20 dB μs | 0.504 | 0.441 | 0.475 |
| Cycle | 3.67 | 3.266 | 3.740 |

In Table 4, Case 4 refers to a case in which a single back efficiency layer has a high acoustic impedance and an acoustic attenuation block has a low acoustic impedance, Case 5 refers to a case in which a single back efficiency layer has a middle acoustic impedance and an acoustic attenuation block has a low acoustic impedance, and Case 6 refers to a case in which a single back efficiency layer has a low acoustic impedance and an acoustic attenuation block has a low acoustic impedance. In this regard, the acoustic impedance of the single back efficiency layer and the acoustic impedance of the acoustic attenuation block are determined according to the Desilets' method.

Comparing Table 4 and Table 1, although there is an example in which the ultrasonic transducer of the third comparative example has as high sensitivity as the ultrasonic transducer 110 according to the exemplary embodiment of the present invention, other characteristics of the example, such as a bandwidth or a pulse length, are very poor compared to those of the ultrasonic transducer 110 according to the exemplary embodiment of the present invention.

As described with reference to Tables 1 to 4, the ultrasonic transducer 110 according to the exemplary embodiment of the present invention may have improved sensitivity, bandwidth, and pulse length characteristics by controlling the acoustic impedances $Z_1$, $Z_2$, and $Z_3$ and the thicknesses $T_1$, $T_2$, and $T_3$ of the back efficiency layers 141, 142, and 143.

Also, Table 5 below shows characteristics of a fourth comparative example of the ultrasonic transducer 110.

TABLE 5

|  | First back efficiency layer | First back efficiency layer | Second back efficiency layer | Acoustic attenuation block |
|---|---|---|---|---|
| Acoustic impedance | 16 MRayl | 6.5 MRayl | 3.5 MRayl | 3.0 MRayl |
| Sensitivity dB, 1 V/V | −61.24 | | | |
| Bandwidth@6 dB % | 84.57 | | | |
| Pulse length @20 dB μs | 0.394 | | | |
| Cycle | 2.81 | | | |

In Table 5, the acoustic impedances Z1, Z2, and Z3 of the back efficiency layers 141, 142, and 143, respectively, are different from those shown in Table 1 and satisfy the inequality of Equation 1. The thicknesses T1, T2, and T3 of the back efficiency layers 141, 142, and 143, respectively are individually controlled to have different values within a range of λ/16 to λ/2.

Referring to Table 1 and Table 5, the first example of the ultrasonic transducer 110 has higher sensitivity than the second example of the ultrasonic transducer 110, but the bandwidth of the second example of the ultrasonic transducer 110 is wider than the bandwidth of the first example of the ultrasonic transducer 110. That is, the ultrasonic transducer 110 according to the exemplary embodiment of the present invention may have a degree of freedom in designing the ultrasonic transducer 110 depending on whether improving a bandwidth characteristic or improving sensitivity characteristic is desired, by controlling the acoustic impedances Z1, Z2, and Z3 of the back efficiency layers 141, 142, and 143. Herein, the sensitivity and bandwidth characteristics of the ultrasonic transducer 110 according to the exemplary embodiment of the present invention are better than those of the first and second examples of the ultrasonic transducer 110, that is, all of the ultrasonic transducers of first to fourth comparative examples described herein.

Figure 3:
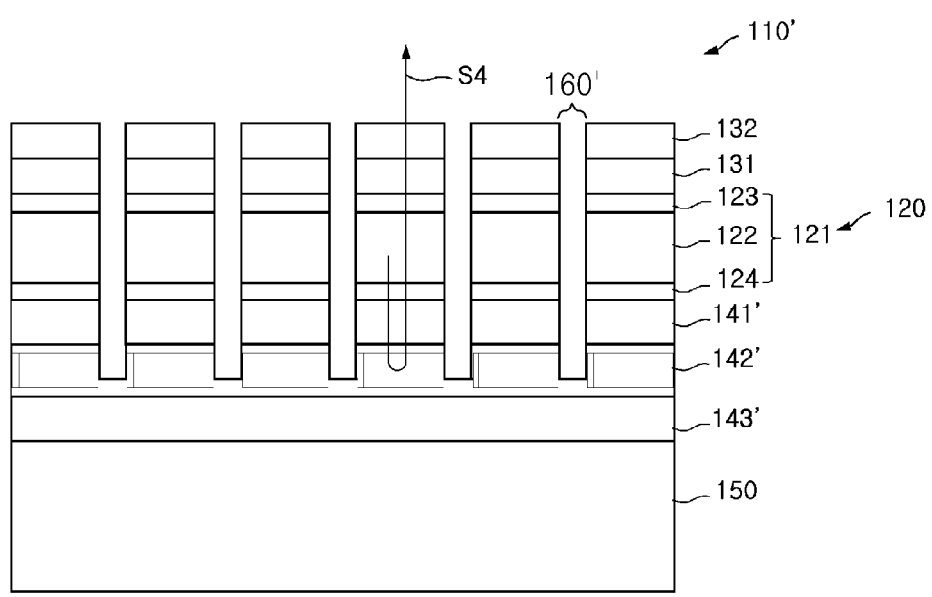
FIG. 3 illustrates another example of the ultrasonic transducer housed in the ultrasonic probe of the ultrasound image diagnosis apparatus illustrated in FIG. 1.

FIG. 3 illustrates an ultrasonic transducer 110' in an alternative exemplary embodiment of the ultrasonic transducer 110 housed in the ultrasonic probe 100 of the ultrasound image diagnosis apparatus of FIG. 1. Referring to FIG. 3, the ultrasonic transducer 110' according to the alternative exemplary embodiment includes the piezoelectric layer 120, the acoustic matching layers 131 and 132 located on the upper surface of the piezoelectric layer 120, and the back efficiency layers 141', 142', and 143' located on the lower surface of the piezoelectric layer 120. The acoustic attenuation block 150 is located under the back efficiency layers 141', 142', and 143'. An acoustic lens layer may be further disposed above the acoustic matching layers 131 and 132.

The piezoelectric layer 120, the acoustic matching layers 131 and 132, and the acoustic attenuation block 150 are substantially the same as the corresponding elements denoted by the same reference numerals which have been described with reference to FIG. 2. Acoustic impedances of the back efficiency layers 141', 142', and 143' may be set to satisfy the inequality of Equation 1 and thicknesses of the back efficiency layers 141', 142', and 143' may be set to be included within a range of $\lambda/16$ to $\lambda/2$. The ultrasonic transducer 110' of the alternative exemplary embodiment of FIG. 3 is different from the ultrasonic transducer 110 of the exemplary embodiment of FIG. 2, in that kerfs 160' for suppressing interferences between the piezoelectric devices 121 extend to at least one of the back efficiency layers 141', 142', and 143', passing through the acoustic matching layers 131 and 132 and the piezoelectric layer 120. Because as in the alternative exemplary embodiment of FIG. 3, the kerfs 160' extend to at least one of the back efficiency layers 141', 142', and 143', the ultrasonic wave S4, has a progressing direction changed to progress backward from the piezoelectric layer 120 among ultrasonic waves that are generated by the piezoelectric devices 121 of the piezoelectric layer 120, but S4 is prevented from progressing toward adjacent piezoelectric devices.

FIG. 3 illustrates that the kerfs 160' extend to the second back efficiency layer 142'. However, the extension length is not limited thereto. The extension length of the kerfs 160' may vary to control characteristics of the ultrasonic transducer 110', and thus, may be appropriately controlled according to a predetermined functionality of the ultrasonic transducer 110'. For example, in another alternative embodiment, the kerfs 160' may extend to only the first back efficiency layer 141', and according to still another alternative embodiment of the present invention, may extend to all of the back efficiency layers 141', 142', and 143'. Also, the ultrasonic transducer 110' includes three back efficiency layers. However, according to a further alternative embodiment of the present invention, the ultrasonic transducer 110' may include two, or four or more back efficiency layers. Even in this case, the extension length of the kerfs 160' may be appropriately controlled according to a predetermined functionality of the ultrasonic transducer 110'.

While an ultrasonic transducer including an improved back efficiency layer structure, an ultrasonic probe including the ultrasonic transducer, and an ultrasound image diagnosis apparatus including the ultrasonic probe, according to the present invention, have been particularly shown and described with reference to exemplary embodiments thereof illustrated in the drawings to help understanding, it will be understood by those of ordinary skill in the art that various changes in form and details may be made therein without departing from the spirit and scope of the present invention as defined by the following claims.

What is claimed is:

1. An ultrasonic transducer comprising:
a piezoelectric layer;
an acoustic matching layer disposed on an upper surface of the piezoelectric layer; and
a plurality of back efficiency layers that are disposed on a lower surface of the piezoelectric layer and have different acoustic impedances, wherein at least one of the plurality of back efficiency layers is configured to change the direction of an ultrasonic wave, wherein the direction of the ultrasonic wave is changed from emerging from the piezoelectric layer and progressing towards the plurality of back efficiency layers to moving from the plurality of back efficiency layers towards the piezoelectric layer,
wherein the acoustic impedances of the back efficiency layers sequentially decrease to a predetermined back efficiency layer, and then increase from the predetermined back efficiency layer in a direction away from the piezoelectric layer.

2. The ultrasonic transducer of claim 1, wherein a thickness of each of the back efficiency layers is in a range of $\lambda/16$ to $\lambda/2$, in which $\lambda$ is an acoustic wavelength of the ultrasonic transducer.

3. The ultrasonic transducer of claim 2, wherein the back efficiency layers have different thicknesses along a longitudinal length of the ultrasonic transducer.

4. The ultrasonic transducer of claim 1, wherein the piezoelectric layer comprises a plurality of piezoelectric devices that are arranged to be spaced apart from each other.

5. The ultrasonic transducer of claim 4, wherein the plurality of piezoelectric devices have kerfs between the piezoelectric devices, wherein the kerfs extend along a longitudinal length of the ultrasonic transducer to only a top surface of a specific back efficiency layer that is the closest to the piezoelectric devices from among the back efficiency layers.

6. The ultrasonic transducer of claim 4, wherein the plurality of piezoelectric devices have kerfs between the piezoelectric devices, wherein the kerfs extend along a longitudinal length of the ultrasonic transducer to at least one of the back efficiency layers.

7. The ultrasonic transducer of claim 1, wherein the acoustic matching layer is at least one of a single layer structure or a multi-layer structure.

8. The ultrasonic transducer of claim 1, further comprising an acoustic attenuation block located under the back efficiency layers.

9. An ultrasonic probe comprising:
an ultrasonic transducer comprising a piezoelectric layer, an acoustic matching layer disposed on an upper surface of the piezoelectric layer, and a plurality of back efficiency layers that are disposed on a lower surface of the piezoelectric layer and have different acoustic impedances, wherein at least one of the plurality of back efficiency layers is configured to change the direction of an ultrasonic wave, wherein the direction of the ultrasonic wave is changed from emerging from the piezoelectric layer and progressing towards the plurality of back efficiency layers to moving from the plurality of back efficiency layers towards the piezoelectric layer; and a housing for housing the ultrasonic transducer, wherein the acoustic impedances of the back efficiency layers sequentially decrease to a predetermined back efficiency later, and then increase from the predetermined back efficiency layer in a direction away from the piezoelectric layer.

10. The ultrasonic probe of claim 9, wherein a thickness of each of the back efficiency layers is in a range of $\lambda/16$ to $\lambda/2$, in which $\mu$ is an acoustic wavelength of the ultrasonic transducer.

11. The ultrasonic probe of claim 10, wherein the back efficiency layers have different thicknesses along a longitudinal length of the ultrasonic transducer.

12. The ultrasonic probe of claim 9, wherein the piezoelectric layer comprises a plurality of piezoelectric devices that are arranged to be spaced apart from each other.

13. The ultrasonic probe of claim 12, wherein the plurality of piezoelectric devices have kerfs between the piezoelectric devices, wherein the kerfs extend along a longitudinal length of the ultrasonic transducer to a top surface of a specific back efficiency layer that is the closest to the piezoelectric devices from among the back efficiency layers.

14. The ultrasonic probe of claim 12, wherein the plurality of piezoelectric devices have kerfs between the piezoelectric devices, wherein the kerfs extend along a longitudinal length of the ultrasonic transducer to at least one of the back efficiency layers.

15. The ultrasonic probe of claim 9, further comprising an acoustic attenuation block located under the back efficiency layers.

16. An ultrasound image diagnosis apparatus comprising:

an ultrasonic probe; and a signal processor that produces an ultrasonic image based on an ultrasonic wave echo signal detected by the ultrasonic probe, wherein the ultrasonic probe comprises:

an ultrasonic transducer comprising a piezoelectric layer, an acoustic matching layer disposed on an upper surface of the piezoelectric layer, and a plurality of back efficiency layers that are disposed on a lower surface of the piezoelectric layer and have different acoustic impedances, wherein at least one of the plurality of back efficiency layers is configured to change the direction of an ultrasonic wave, wherein the direction of the ultrasonic wave is changed from emerging from the piezoelectric layer and progressing towards the plurality of back efficiency layers to moving from the plurality of back efficiency layers towards the piezoelectric layer; and a housing for housing the ultrasonic transducer, wherein the acoustic impedances of the back efficiency layers sequentially decrease to a predetermined back efficiency layer, and then increase from the predetermined back efficiency layer in a direction away from the piezoelectric layer.

* * * * *

UNITED STATES PATENT AND TRADEMARK OFFICE
CERTIFICATE OF CORRECTION

PATENT NO. : 9,219,220 B2  
APPLICATION NO. : 13/688749  
DATED : December 22, 2015  
INVENTOR(S) : Hyun-phill Ko et al.

Page 1 of 1

It is certified that error appears in the above-identified patent and that said Letters Patent is hereby corrected as shown below:

In The Claims

Column 11, Claim 9, Line 6 should read as follows:
--...efficiency layer, and then...--

Column 11, Claim 10, Line 11 should read as follows:
--...in which $\lambda$ is...--

Signed and Sealed this
Twenty-second Day of March, 2016

Michelle K. Lee
*Director of the United States Patent and Trademark Office*